(12) United States Patent  
Ogura

(10) Patent No.: US 9,405,019 B2  
(45) Date of Patent: Aug. 2, 2016

(54) FLUORESCENT DEVICE, IRRADIATION APPARATUS, AND PROJECTOR APPARATUS

(71) Applicant: CASIO COMPUTER CO., LTD., Shibuya-ku, Tokyo (JP)

(72) Inventor: Naotsugu Ogura, Hamura (JP)

(73) Assignee: CASIO COMPUTER CO., LTD., Tokyo (JP)

( * ) Notice: Subject to any disclaimer, the term of this patent is extended or adjusted under 35 U.S.C. 154(b) by 179 days.

(21) Appl. No.: 13/794,758

(22) Filed: Mar. 11, 2013

(65) Prior Publication Data

US 2013/0250248 A1   Sep. 26, 2013

(30) Foreign Application Priority Data

Mar. 21, 2012  (JP) ................. 2012-064215

(51) Int. Cl.
| | |
|---|---|
| G03B 21/14 | (2006.01) |
| F21V 9/08 | (2006.01) |
| G01T 1/20 | (2006.01) |
| H01L 33/50 | (2010.01) |
| G03B 21/20 | (2006.01) |

(52) U.S. Cl.
CPC ... *G01T 1/20* (2013.01); *F21V 9/08* (2013.01); *G03B 21/14* (2013.01); *G03B 21/204* (2013.01); *H01L 33/502* (2013.01)

(58) Field of Classification Search
CPC ....... G03B 21/204; F21V 9/08; H01L 33/502; G01T 1/20
USPC ...................... 353/31, 84; 313/483, 501, 502; 362/294, 800, 84; 257/706, 707
See application file for complete search history.

(56) References Cited

U.S. PATENT DOCUMENTS

| | | | |
|---|---|---|---|
| 7,691,765 B2 | 4/2010 | Suzuki et al. | |
| 8,096,668 B2* | 1/2012 | Abu-Ageel | ............... 362/84 |
| 8,192,053 B2 | 6/2012 | Owen et al. | |
| 8,496,356 B2 | 7/2013 | Owen et al. | |
| 8,733,993 B2* | 5/2014 | Takahashi et al. | ........... 362/538 |
| 2005/0105301 A1 | 5/2005 | Takeda et al. | |
| 2006/0227302 A1 | 10/2006 | Harbers et al. | |
| 2008/0149166 A1* | 6/2008 | Beeson | ............ H01L 31/02322 136/248 |
| 2010/0083296 A1* | 4/2010 | Park et al. | .................... 720/712 |

(Continued)

FOREIGN PATENT DOCUMENTS

| | | |
|---|---|---|
| CN | 101936505 A | 1/2011 |
| JP | 05047312 A | 2/1993 |

(Continued)

OTHER PUBLICATIONS

Extended European Search Report (EESR) dated Jul. 3, 2013 (in English) in counterpart European Application No. 13160271.6.

(Continued)

*Primary Examiner* — William C Dowling
(74) *Attorney, Agent, or Firm* — Holtz, Holtz & Volek PC

(57) ABSTRACT

A fluorescent device includes a fluorescent material. The fluorescent material radiates emission light. The fluorescent material is irradiated with excitation light. The fluorescent material has a convex-concave shape. The convex-concave shape is provided on a surface different from an irradiation surface. The irradiation surface is irradiated with the excitation light.

8 Claims, 4 Drawing Sheets

(56) References Cited

U.S. PATENT DOCUMENTS

| | | |
|---|---|---|
| 2010/0202129 A1* | 8/2010 | Abu-Ageel ................. 362/84 |
| 2011/0043761 A1 | 2/2011 | Miyamae |
| 2012/0057364 A1* | 3/2012 | Kishimoto et al. ........... 362/538 |
| 2012/0188518 A1* | 7/2012 | Mukouyama et al. ......... 353/31 |
| 2014/0078475 A1 | 3/2014 | Masuda |
| 2014/0146547 A1 | 5/2014 | Tsutsumi et al. |

FOREIGN PATENT DOCUMENTS

| | | |
|---|---|---|
| JP | 2003-258308 A | 9/2003 |
| JP | 2006-282447 A | 10/2006 |
| JP | 2008153466 A | 7/2008 |
| JP | 2009-129683 A | 6/2009 |
| JP | 2010-024278 A | 2/2010 |
| JP | 2011043596 A | 3/2011 |
| JP | 2013038115 A | 2/2013 |
| WO | WO 03/096387 A2 | 11/2003 |

OTHER PUBLICATIONS

Chinese Office Action (and English translation thereof) dated May 4, 2015, issued in counterpart Chinese Application No. 201310122195.2.

Japanese Office Action (and English translation thereof) dated Oct. 27, 2015, issued in counterpart Japanese Application No. 2012-064215.

* cited by examiner

US 9,405,019 B2

FLUORESCENT DEVICE, IRRADIATION APPARATUS, AND PROJECTOR APPARATUS

CROSS-REFERENCE TO RELATED APPLICATIONS

This application is based upon and claims the benefit of priority from prior Japanese Patent Application No. 2012-064215, filed Mar. 21, 2012, the entire contents of which are incorporated herein by reference.

BACKGROUND OF THE INVENTION

1. Field of the Invention

The present invention relates to a fluorescent device which emits light emitted by irradiating a fluorescent material with excitation light, a lighting apparatus which outputs irradiation light in various colors by using the fluorescent device, and a projector apparatus which uses and projects the irradiation light output from the irradiation apparatus, as a color image.

2. Description of the Related Art

A light source apparatus employs a light emitter which is irradiated with excitation light output from a light source and thereby emits light having a different wavelength from the excitation light. The light source apparatus is used as a light source in various applications; for example, in a lighting apparatus and an image display apparatus.

Such light source apparatuses as mentioned above generally use a light emitting diode (LED) and a laser diode (LD) as light sources, e.g., as semiconductor light sources in many cases. For example, transparent silicone or epoxy resin is used as a resinous binder. A plurality of fluorescent materials are scattered in the resinous binder and form a light emission layer.

The resinous binder is damaged when deterioration is high or particularly intensity of excitation light is high due to excitation light from a semiconductor light source. Further, silicone or a resin such as epoxy resin with scattered fluorescent materials has a low heat conductivity and therefore increases the temperature of the fluorescent materials. The increase in temperature results in shifting of a light emission wavelength of light emitted from the fluorescent materials or a phenomenon of temperature quenching in which light emission intensity lowers. Therefore, luminosity of the light source apparatus deteriorates. For example, substitute materials for the transparent silicone or epoxy resin of the resinous binder are disclosed in, for example, Jpn. Pat. Appln. KOKAI Publication No. 2003-258308, Jpn. Pat. Appln. KOKAI Publication No. 2006-282447, and Jpn. Pat. Appln. KOKAI Publication No. 2010-024278. Jpn. Pat. Appln, KOKAI Publication No. 2003-258308 discloses use of a light-transmissible inorganic material, such as glass. Jpn. Pat. Appln. KOKAI Publication No. 2006-282447 and Jpn. Pat. Appln. KOKAI Publication No. 2010-024278 each disclose use of ceramics having a high heat conductivity.

A light emission layer of the fluorescent material formed by using the aforementioned binder (light-transmissible ceramic binder) using ceramics having light-transmissibility is often used as a substitute for a light emission layer using fluorescent materials formed by using the aforementioned resinous binder. Therefore, the light emission layer of the fluorescent materials does not have a structure capable of preventing shifting of a light emission wavelength of light emitted from the fluorescent materials or deterioration of light emission intensity which is caused by temperature increase.

BRIEF SUMMARY OF THE INVENTION

The invention has an object to provide a fluorescent device, an irradiation apparatus, and a projector apparatus, which are capable of preventing an emission light wavelength of light emitted by fluorescent materials from shifting or a decrease in light emission intensity due to temperature increase.

A fluorescent device according to a first aspect of the present invention comprises a fluorescent material which radiates emission Light as the fluorescent material is irradiated with excitation light, with a convex-concave shape being provided on a surface different from an irradiation surface which is irradiated with the excitation light.

An irradiation apparatus according to a second aspect of the present invention comprises the fluorescent device; an excitation light source which outputs excitation light; an irradiation optical system which irradiates the fluorescent device with the excitation light output from the excitation light source; and an emission-light-extraction optical system which extracts, as irradiation light, the emission light emitted from the fluorescent device.

A projector apparatus according to a third aspect of the present invention comprises the irradiation apparatus; and a projection optical system which projects, as a color image, light of colors including the irradiation light output from the irradiation apparatus.

According to the invention, there is provided a fluorescent device, an irradiation apparatus, and a projector apparatus, which are capable of preventing an emission light wavelength of light emitted by fluorescent materials from shifting or a decrease in light emission intensity due to temperature increase.

DETAILED DESCRIPTION OF THE INVENTION

First Embodiment

Hereinafter, the first embodiment of the invention will be described.

Figure 1A:
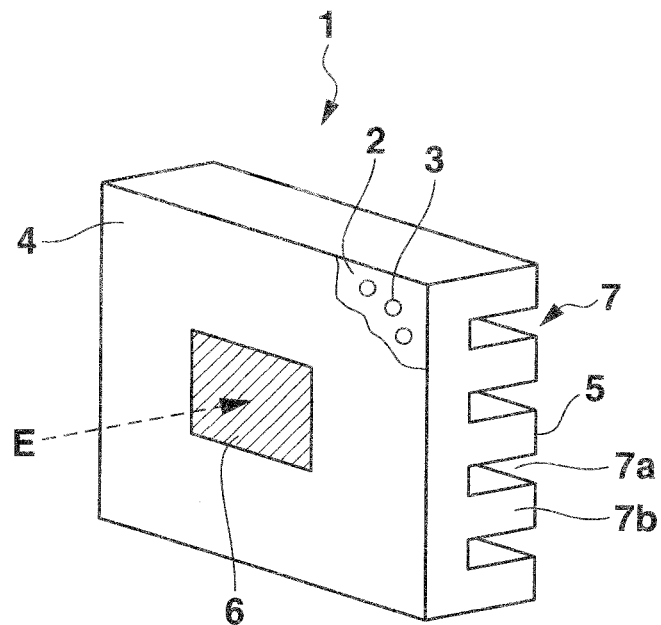
FIG. 1A is an exterior structure diagram showing a side of a fluorescent device, which is irradiated with excitation light, according to the first embodiment of the invention.
Figure 1B:
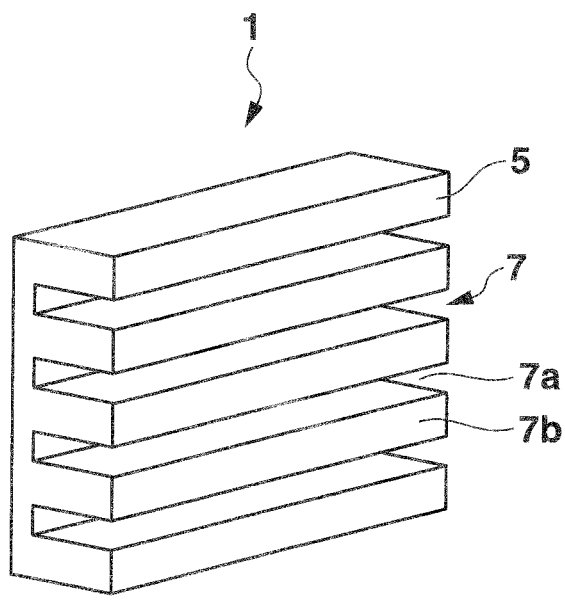
FIG. 1B is an exterior structure diagram showing a side of the fluorescent device, which is opposite to the side irradiated with excitation light, according to the first embodiment of the invention.

FIG. 1A and FIG. 1B are structure diagrams of a fluorescent device. FIG. 1A shows an exterior of a side irradiated with excitation light. FIG. 1B shows an exterior of a side opposite to the side irradiated with the excitation light. The fluorescent device 1 is formed by sintering a light-transmissible inorganic material (hereinafter referred to as an inorganic binder) 2 such as Al2O3, and a plurality of fluorescent materials 3 such as YAG:Ce. The plurality of fluorescent materials 3 are scattered, for example, at uniform intervals in the inorganic binder 2. The fluorescent materials 3 emit green light (having a wavelength value within a wavelength range of 492 to 577 nm) in accordance with irradiation of excitation light E of blue color (having a wavelength value in a wavelength range of 455 to 492 nm). The fluorescent device 1 has a surface formed in a quadrilateral shape as viewed from the side irradiated with the excitation light E but is not limited to a quadrilateral shape.

A surface of the fluorescent device 1 which is to be irradiated with the excitation light E is referred to as an irradiation surface 4, and the surface opposite to the irradiation surface 4 is referred to as an opposite surface 5. The irradiation surface 4 is formed planar. Further, an area of the irradiation surface 4 which is irradiated with the excitation light E is referred to as an irradiation area 6. The irradiation surface 4 and the opposite surface 5 face each other in parallel.

A convex-concave shape 7 is formed on the whole of the surface different from the irradiation surface 4, i.e., the opposite surface 5 in the present embodiment. The convex-concave shape 7 is provided to radiate heat of the fluorescent device 1. The convex-concave shape 7 is formed by alternately arranging a plurality of concave parts 7a formed linearly and a plurality of convex parts 7b formed linearly. In other words, the convex-concave shape 7 is formed by providing the plurality of convex parts 7b in parallel. Accordingly, each concave part 7a is formed between one another of the concave parts 7b. Each of the convex parts 7b serves as a cooling fin which radiates heat.

The convex-concave shape 7 is formed by sintering, for example, the inorganic binder 2 of Al2O3 and a plurality of fluorescent materials 3 such as YAG:Ce, as in the fluorescent device 1. The plurality of fluorescent materials 3 are scattered at uniform intervals in the inorganic binder 2. Accordingly, the convex-concave shape 7 is formed to be integral with the fluorescent device 1.

The location of the convex-concave shape 7 is not limited to the opposite surface 5 but may be on a side surface of the fluorescent device 1 or a portion of the irradiation surface 4 which does not influence an irradiation area 6.

In the fluorescent device 1 as described above, when blue excitation light E (wavelength value in the wavelength range of 455 to 492 nm) enters the fluorescent device 1 and the convex-concave shape 7 from the irradiation surface 4, for example, the plurality of fluorescent materials 3 scattered in the inorganic binder 2 in each of the fluorescent device 1 and the convex-concave shape 7 are irradiated with the excitation light E. The fluorescent materials 3 each are excited by irradiation of the excitation light E, and emit light with an arbitrary wavelength distribution. For example, each of the fluorescent materials 3 emits, for example, green emission light (a wavelength value in the wavelength range of 492 to 577 nm). The emission light penetrates the irradiation surface 4, and is projected outside the fluorescent device 1.

In the state of projecting emission light, there is a case that the intensity of the excitation light E irradiated on the fluorescent device 1 is high or the temperature of each of the fluorescent materials 3 is caused to rise, thereby increasing the temperature of the fluorescent device 1. Heat generated due to the temperature increase is transferred from the fluorescent device 1 to the convex-concave shape 7, and is radiated from the convex-concave shape 7. Since the convex-concave shape 7 includes a plurality of concave parts 7a and a plurality of convex parts 7b, which form cooling fins, the convex-concave shape 7 enlarges a heat radiation area, and heat radiation efficiency is excellent. In particular, heat is radiated from the plurality of convex parts 7b forming the cooling fins, and the temperature increase of the fluorescent device 1 can be suppressed accordingly.

Thus, according to the foregoing first embodiment, the convex-concave shape 7 is provided on the whole of the surface different from the irradiation surface 4 irradiated with the excitation light E, e.g., on the whole opposite surface 5. Therefore, for example, even when the strength of the excitation light E irradiated on the fluorescent device 1 is high or even when the temperature increase occurs in each of the fluorescent materials 3 and causes a temperature increase of the fluorescent device 1, the heat caused by the temperature increase is radiated from the convex-concave shape 7. Therefore, a temperature increase of the fluorescent device 1 can be suppressed. As a result, the light emission wavelength of light emitted from the fluorescent materials is not caused to shift due to temperature increase, or the light emission intensity does not decrease to cause a phenomenon such as temperature quenching. In this manner, deterioration in the luminosity of the light source apparatus, which may be caused by a temperature increase, does not occur.

Second Embodiment

Next, the second embodiment of the invention will be described with reference to the drawings. The same parts as those in FIG. 1A and FIG. 1B will be denoted with the same reference signs, respectively. Detailed descriptions thereof will be omitted.

Figure 2A:
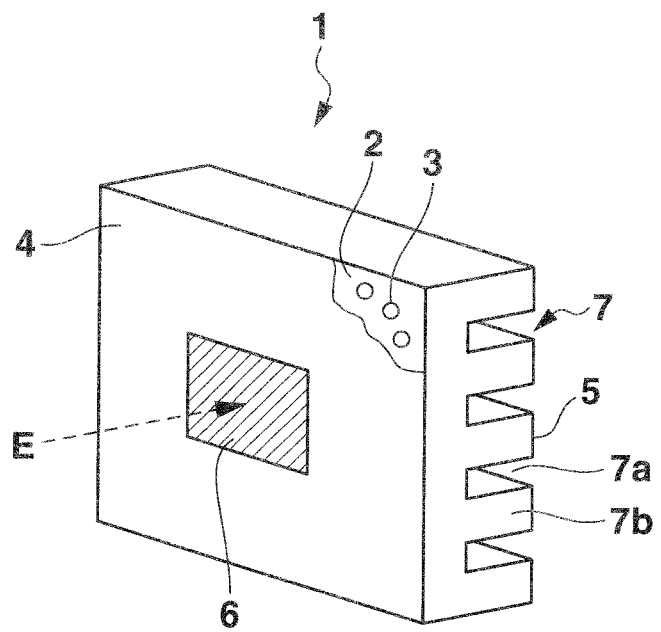
FIG. 2A is an exterior structure diagram showing a side of a fluorescent device, which is irradiated with excitation light, according to the second embodiment of the invention.
Figure 2B:
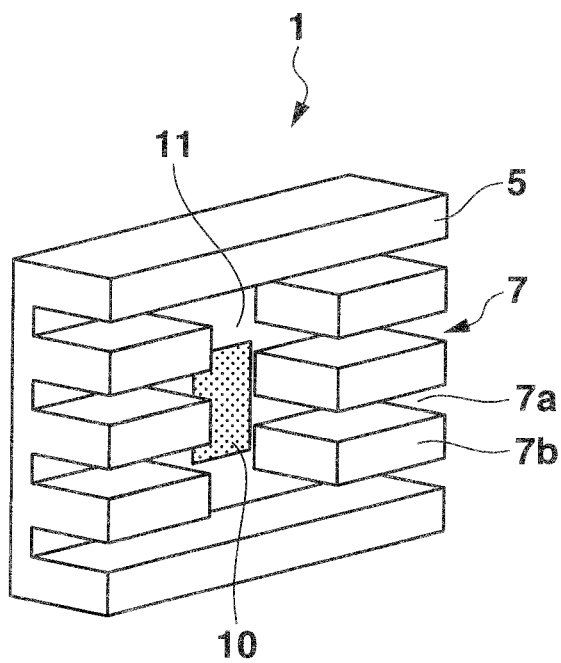
FIG. 2B is an exterior structure diagram showing a side of the fluorescent device, which is opposite to the side irradiated with excitation light, according to the second embodiment of the invention.

FIG. 2A and FIG. 2B are structure diagrams of a fluorescent device. FIG. 2A shows an exterior on a side irradiated with excitation light. FIG. 2B shows an exterior on a side opposite to the side irradiated with the excitation light.

A reflective layer 10 is provided on an opposite surface 5 which faces, and is parallel to, an irradiation surface 4 of the fluorescent device 1. The reflective layer 10 reflects emission light emitted from the fluorescent materials 3. The reflective layer 10 is provided in an area of the opposite surface 5 corresponding to an irradiation area 6 of the irradiation surface 4 which is irradiated with the excitation light E.

In the area where the convex-concave shape 7 is provided, a flat, area 11 is formed in an area of the opposite surface 5 corresponding to the irradiation area 6. The reflection area 11 is provided in a partial area of the convex-concave shape 7, and the plurality of convex parts 7b are not provided.

The reflective layer 10 is provided in the flat area 11. The reflective layer 5 is formed of a metal reflective film, such as silver or aluminum, or a multilayered optical reflective film made by layering a metal oxide and a fluoride. The reflective layer 10 reflects, for example, light of a green wavelength range (492 nm to 577 nm), for example.

The reflective layer 10 is provided on the flat area 11 as a part of the convex-concave shape 7. However, the reflective layer is not limited to this location but may be provided on the whole surface of the flat area 11 and on the whole bottom surfaces of the plurality of concave parts 7a on the opposite surface 5 of the fluorescent device 1.

In the fluorescent device 1 as described above, for example, when blue excitation light E (a wavelength value in the wavelength range of 455 to 492 nm) enters the fluorescent device 1 and the convex-concave shape 7 from the irradiation surface 4, the plurality of fluorescent materials 3 scattered in the inorganic binder 2 in each of the fluorescent device 1 and the convex-concave shape 7 are irradiated with the excitation light E, as described above. The fluorescent materials 3 are respectively excited by irradiation of the excitation light E and emit light with an arbitrary wavelength distribution. Each of the fluorescent materials 3 emits, for example, green emission light (a wavelength value in the wavelength of 492 to 577 nm). The emission light penetrates the irradiation surface 4, and is emitted outside the fluorescent device 1.

Simultaneously, part of the fluorescent light irradiated from each of the fluorescent materials 3, which travels toward the reflective layer 10, penetrates the irradiation surface 4, and is projected outside the fluorescent device 1.

In the state of thus projecting emission light, there is a case that the intensity of the excitation light E irradiated on the fluorescent device 1 is high or a temperature increase of each of the fluorescent materials 3 occurs and increases the temperature of the fluorescent device 1. Then, heat generated by the temperature increase is transferred from the fluorescent device 1 to the convex-concave shape 7, and is radiated from the convex-concave shape 7.

Thus, according to the second embodiment, the convex-concave shape 7 is provided on the surface different from the irradiated surface 4 irradiated with the excitation light 5, i.e., the whole opposite surface 5 in this case. In addition, the reflective layer 10 is provided on the opposite surface 5 in parallel with the irradiation surface 4. In this manner, as in the first embodiment, the light emission wavelength of light emitted from the fluorescent materials 3 is not caused to shift due to temperature increase, and the light emission intensity does not decrease to cause a phenomenon such as temperature quenching. As a result, there is no deterioration in the luminosity of the light source apparatus due to a temperature increase.

Since the reflective layer 10 is provided, part of fluorescent light irradiated from each of the fluorescent materials 3, which travels toward the reflective layer 10, penetrates the irradiation surface 4, and is emitted outside the fluorescent device 1. In this manner, the emission light which is emitted from each of the fluorescent materials 3 can be efficiently projected outside the fluorescent device 1. If the reflective layer 10 is provided on the whole surface of the flat area 11 and the whole bottom surfaces of the plurality of concave parts 7a in the opposite surface 5 of the fluorescent device 1, the efficiency of the emission light emitted outside the fluorescent device 1 can further be improved.

Third Embodiment

Next, the third embodiment of the invention will be described with reference to the drawings.

Figure 3:
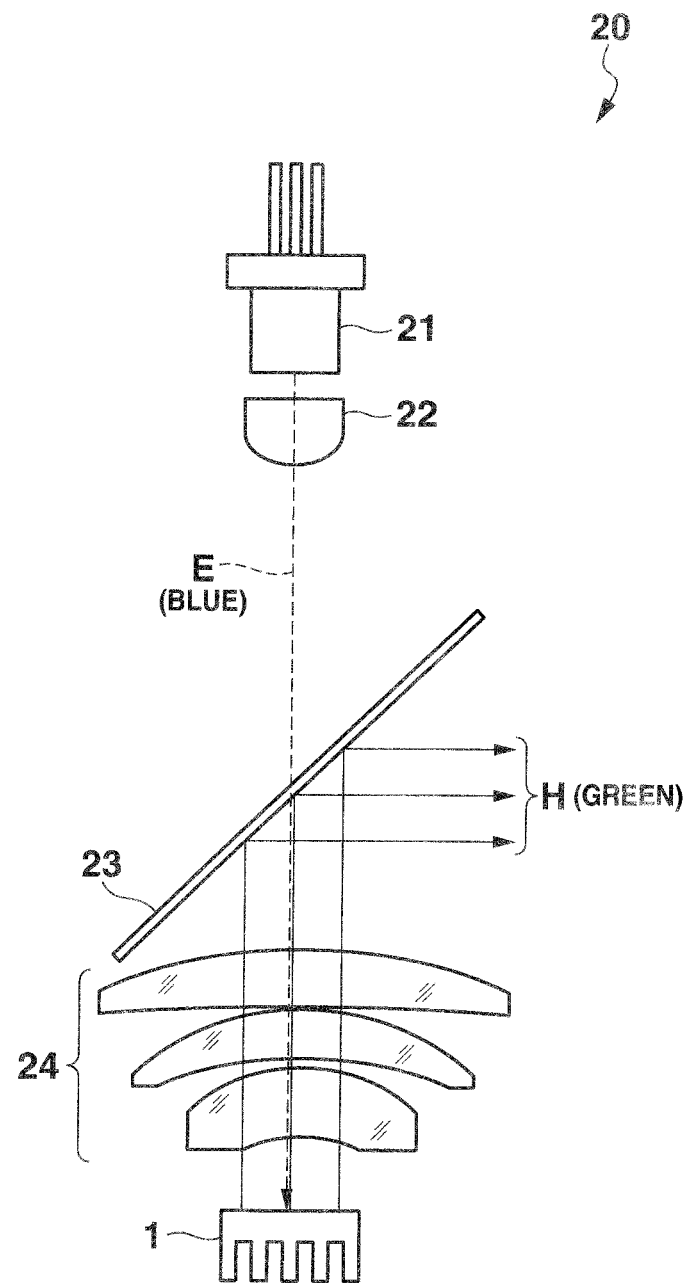
FIG. 3 is a configuration diagram showing a fluorescent device according to the third embodiment of the invention.

FIG. 3 shows a configuration of an irradiation apparatus 20 which uses a fluorescent device 1. The same parts as those in FIG. 1A and FIG. 1B will be denoted with the same reference signs, respectively. Detailed descriptions thereof will be omitted.

A semiconductor laser 21 is provided as an excitation light source. The semiconductor laser 21 outputs, for example, an excitation laser beam (hereafter referred to as the excitation laser light E) of a wavelength value in a blue wavelength range (455 to 492 nm) as the excitation light E.

On an optical path of the excitation laser light E output from the semiconductor laser 21, there are provided a collimator lens 22, a dichroic mirror 23 as an emission-light-extraction optical system, and a convergence optical system 24 as an irradiation optical system.

The collimator lens 22 collimates the excitation laser light H output from the semiconductor laser 11.

The convergence optical system 24 converges and irradiates the fluorescent device 1 toward the excitation laser light E output from the semiconductor laser 21.

The dichroic mirror 23 allows the excitation laser light E collimated by the collimator lens 22 to pass through, and emits light from the fluorescent device 1 outside the fluorescent device 1. The dichroic mirror 23 also reflects irradiation light H which travels through the convergence optical system 24, and extracts the light as irradiation light. The dichroic mirror 23 allows the excitation laser light E having a wavelength value in the blue wavelength range (455 to 492 nm) to pass and reflects the emission light having a wavelength value in a green wavelength range (492 to 577 nm) emitted by the fluorescent device 1.

In the irradiation apparatus as described above, the excitation laser light E having a blue wavelength value is output from the semiconductor laser 21. The excitation laser light E is collimated by the collimator lens 22, and enters the dichroic mirror 23. The excitation laser light E penetrates the dichroic mirror 23, is converged by the conversion optical system 24, and is irradiated onto the collimator lens 22.

When the excitation laser light E enters the fluorescent device 1 and the convex-concave shape 7 from the irradiation surface 4, the plurality of fluorescent materials 3 scattered in the inorganic binder 2 in each of the fluorescent device 1 and the convex-concave shape 7 are irradiated with the excitation laser light E. The fluorescent materials 3 are each excited by irradiation of the excitation laser light E, and emit light with an arbitrary wavelength distribution. For example, each of the fluorescent materials 3 emits, for example, green emission light (a wavelength value in the wavelength range of 492 to 577 nm). The emission light penetrates the irradiation surface 4 and is projected outside the fluorescent device 1.

In the state of projecting emission light, there is a case that the intensity of the excitation light E irradiated on the fluorescent device 1 is high or a temperature increase of each of the fluorescent materials 3 occurs and increases the temperature of the fluorescent device 1. Then, heat generated by the temperature increase is transferred from the fluorescent device 1 to the convex-concave shape 7, and is radiated from the convex-concave shape 7.

The emission light having a green wavelength, which is projected from the fluorescent device 1 enters the dichroic mirror 23 through the convergence optical system 24. The light is further reflected by the dichroic mirror 23 and is extracted as the irradiation light H from the fluorescent device 1.

With the fluorescent device 1 configured according to the third embodiment described above, the excitation laser light E having a blue wavelength value output from the semiconductor laser 21 is irradiated onto the fluorescent device 1 through the collimator lens 22, dichroic mirror 23, and convergence optical system 24. The emission light H having a green wavelength value emitted from the fluorescent device 1 is extracted by the dichroic mirror 23 through the convergence optical system 24. In this manner, emission light having, for example, a green wavelength value can be output as irradiation light from each of the fluorescent materials 3, which is efficiently extracted from the fluorescent device 1.

In the fluorescent device 1, as in the first embodiment, the light emission wavelength of light emitted from the fluorescent materials 3 is not caused to shift due to temperature increase. Further, the light emission intensity does not decrease to cause a phenomenon such as temperature quenching. As a result, the luminosity of the light source apparatus does not suffer from deterioration due to temperature increase.

The fluorescent device 1 as shown in FIG. 1A and FIG. 1B is used herein. However, the fluorescent device 1 shown in FIG. 2A and FIG. 2B may be used instead. By using the latter fluorescent device 1, not only are the effects as described previously obtained but also the emission light emitted from each of the fluorescent materials 3 can be efficiently emitted outside the fluorescent device 1 since the reflective layer 10 is provided. If the reflective layer 10 is provided on the whole surface of the flat area 11 and the whole bottom surfaces of the plurality of concave parts 7a in the opposite surface 5 of the fluorescent device 1, the emission light can be emitted outside the fluorescent device 1 with further improved efficiency, and can be efficiently output as irradiation light H.

Although one fluorescent device 1 is provided herein, the number of devices 1 is not limited and a plurality of fluorescent devices may be provided. Emission light from each of the plurality of fluorescent materials 3, which has been efficiently extracted from the plurality of fluorescent devices 1, can be output as irradiation light. In addition, emission light from each of the fluorescent materials 3, which has also been efficiently extracted from the plurality of fluorescent devices 1, is output as irradiation light. In this manner, irradiation light H of a greater luminosity amount can be extracted than irradiation light extracted from one fluorescent device 1.

Fourth Embodiment

Next, the fourth embodiment of the invention will be described with reference to the drawings.

Figure 4:
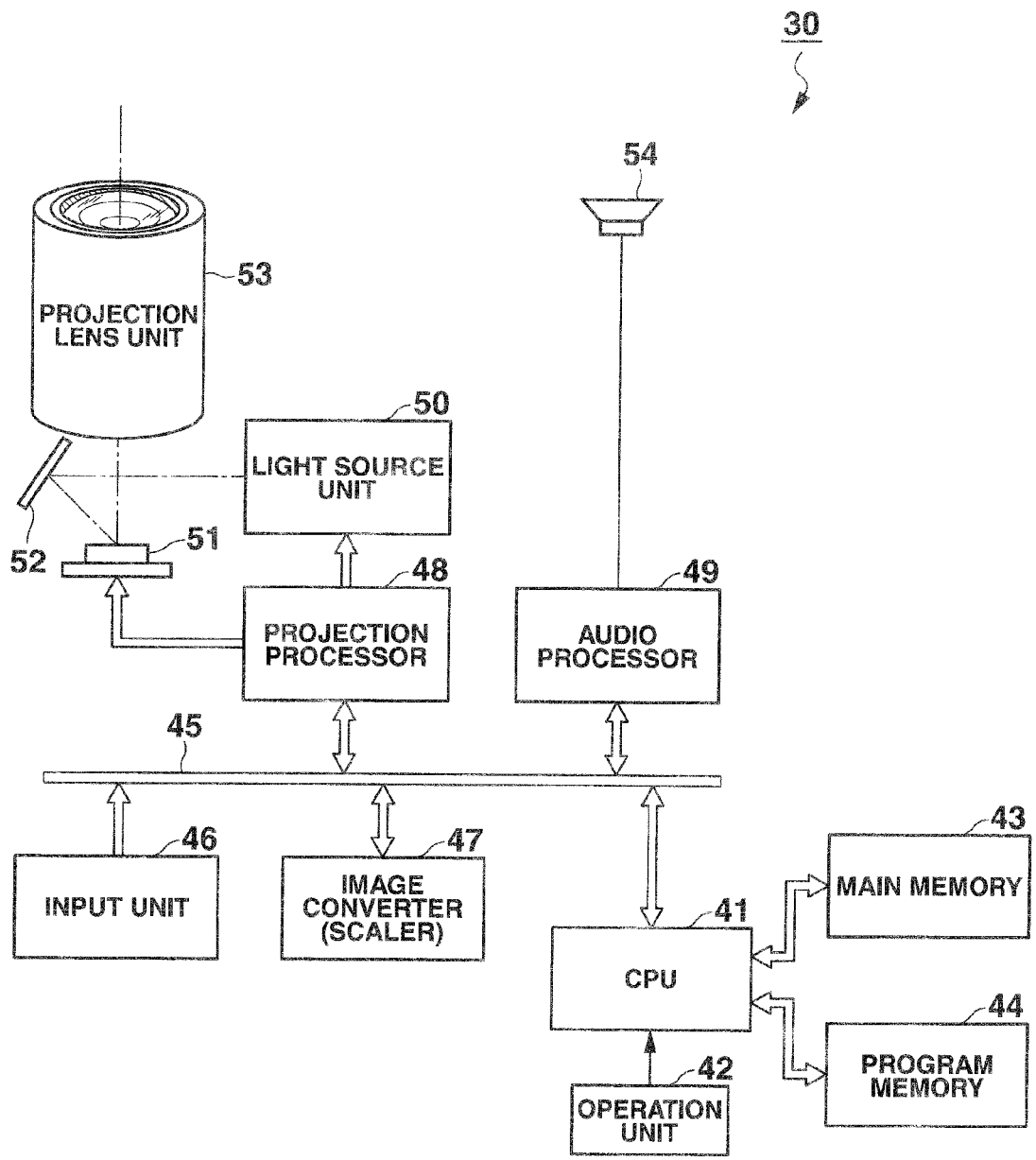
FIG. 4 is a configuration diagram showing a projector apparatus using a fluorescent device according to the fourth embodiment of the invention.

FIG. 4 shows a configuration of a projector apparatus 30 which uses an irradiation apparatus 30 shown in FIG. 3. The projector apparatus 30 employs, for example, a digital light processing (DLP: registered trademark) system which uses, for example, a semiconductor light emitting element. A CPU 41 is mounted on the projector apparatus 30. An operation unit 42, a main memory 43, and a program memory 44 are connected to the CPU 41. An input unit 46, an image converter 47, projection processor 48, and an audio processor 49 are connected to the CPU 41 through a system bus 45. A light source unit 50 and a micro mirror element 51 are connected to the projection processor 48. A mirror 52 is arranged on an optical path of irradiation light output from the light source unit 50, and the micro mirror element 51 is arranged on a reflective optical path of the mirror 52. A projection lens unit 53 is arranged on a reflective optical path of the micro mirror element 51. A loudspeaker unit 54 is connected to the audio processor 49.

The input unit 46 is input with an analog image signal according to any of various standards, and feeds the analog image signal as digitized image data to the image converter 47 through the system bus 45.

The image converter 47 is also referred to as a scaler, and performs a processing of uniformizing image data input from the input unit 46 into image data of a predetermined format which is suitable for projection, and feeds the image data to the projection processor 48. At this time, the image converter 47 performs a processing of superimposing data of symbols indicating various operation states for on-screen display (OSD) onto the image data, as needed, and further feeds the processed image data to the projection processor 48.

The projection processor 48 drives the micro mirror element 51, which is a spatial optical modulator, in a manner of high-speed time-divisional driving in which a frame rate of, for example, 60 frames/second, a number of color components, and a number of display gradations are multiplied in compliance with a predetermined format, according to the image data fed the from the image converter 47.

The audio processor 49 comprises a sound source circuit, such as a pulse-code-modulation (PCM) sound source, and converts audio data supplied during the projection operation into an analog signal. The audio processor 48 enhances and outputs the signal through the loudspeaker unit 54 or generates a beep sound, etc., as needed.

The micro mirror element 51 adopts, for example, the Wide Extended Graphics Array (WXGA) and is formed by arranging a plurality of micro mirrors in an array, e.g., an array of width×height of 1250×800 pixels. The individual micro mirrors are each on/off operated to incline at a high speed, to display an image, forming an optical image by reflection light, thereof.

The light source unit 50 emits a cyclical irradiation light, of a plurality of colors including prime colors of red (R), green (G), and blue (B) sequentially in a time-division manner. Each light of R, G, and B sequentially emitted from the light source unit 50 is totally reflected by the mirror 52 and is irradiated onto the micro mirror element 51. An optical image is formed by the reflection light from the micro mirror element 51. The formed optical image is projected and displayed as a color image onto a screen as a projection target through the projection lens unit 53 as a projection optical system.

The light source unit 50 is configured by using, for example, an irradiation apparatus 20 shown in FIG. 3. above. The light source unit 50 comprises: a semiconductor laser which outputs laser light having a wavelength within a wavelength range (622 to 777 nm) of red (R); a semiconductor laser 11 which outputs laser light having a wavelength value within a wavelength range (455 to 492 nm) of blue (B); and the irradiation apparatus 20 shown in FIG. 3 which outputs irradiation light having a wavelength value of green (G), using the laser light output from the semiconductor laser 11 as excitation light. The light source unit 50 emits irradiation light of red (R), green (C), and blue (B) sequentially in a time-division manner.

The CPU 41 receives an operation instruction from the operation unit 42, reads/writes data from/into the main memory 43, and performs a program stored in the program memory 44. The CPU 41 controls the input unit 46, image converter 47, projection processor 48, and audio processor 49 through the system bus 45. That is, the CPU 41 performs control operation in the projector apparatus 40 by using the main memory 43 and the program memory 44.

The main memory 43 is configured by, for example, an SRAM and functions as a work memory for the CPU41. The program memory 44 is configured by an electrically rewritable nonvolatile memory, and stores an operation program executed by the CPU41 and data of various fixed forms.

The CPU41 performs a variety of projection operations according to key operation signals from the operation unit 42. The operation unit 42 comprises a key operation unit provided on a body of the projector apparatus 30, and an infrared light receiving unit which receives infrared light from a remote controller dedicated for the projector apparatus 30. The operation unit 42 directly feeds, to the CPU 41, a key operation signal based on a key operated by the key operation unit of the body or by a remote controller of the projector apparatus 30.

In the configuration as described above, when an analog image signal according to any of various standards is input to the input unit 46, the input unit 46 then feeds the analog signal as digitized image data to the image converter 47 through the system bus 45.

The image converter 47 performs a processing of uniformizing image data input from the input unit 46 into image data of a predetermined format which is suitable for projection, and also performs a superimposing process of superimposing data such as symbols indicating various operation states for OSD onto image data, as needed. After the superimposing process, the image conversion unit 47 feeds the processed image data to the projection processor 48.

The projection processor 48 drives the micro mirror element 51 as a spatial optical modulator in a manner of high-speed time-divisional driving in which a frame rate of, for example, 60 frames/second, a number of color components, and a number of display gradations are multiplied in compliance with a predetermined format, according to the image data fed from the image converter 47.

The micro mirror element 51 operates to turn on/off each of inclination angles of a plurality of micro mirrors at a high speed, respectively, by driving the projection processor 48 to display an image and to form an optical image by reflection light thereof.

The light source unit 50 sequentially emits green (G) irradiation light output from, for example, the irradiation apparatus 20 shown in FIG. 3, laser light of blue (B) having a wavelength value output from a semiconductor laser 11, and laser light of red (R) having a wavelength value output from another semiconductor laser, cyclically in a time-division manner. Irradiation light of R, G, and B sequentially emitted from the light source unit 50 is totally reflected by the mirror 52 and is irradiated onto the micro mirror element 51. An optical image is formed by the reflection light from the micro mirror element 51. The formed optical image is projected and displayed as a color image onto a screen as a projection target through the projection lens unit 53.

Simultaneously, the audio processor 49 converts audio data supplied during the projection operation into an analog signal. The audio processor 48 enhances and outputs the signal through the loudspeaker unit 54 or generates a beep sound, etc., as needed.

Thus, according to the fifth embodiment described above, the projector apparatus 30 is configured by using the irradiation apparatus 20 shown in FIG. 3 as the light source unit 50. The irradiation wavelength emitted from the fluorescent materials is not caused to shift by temperature increase. In other words, the fluorescent device 1 does not suffer from lower light emission intensity caused by a phenomenon such as temperature quenching. Deterioration of luminosity, which may be caused by temperature increase of the projector apparatus 30, does not occur. In the projector apparatus 30 as described above, a color image can be projected and displayed onto a screen by using, as irradiation light, emission light from each of fluorescent materials 3 efficiently extracted from the fluorescent device 1.

The invention is not exactly limited to the foregoing embodiments but can be performed with components thereof modified in practical phases without deviating from the subject matter of the invention. Various inventions can be derived from appropriate combinations of a plurality of components disclosed in the foregoing embodiments. For example, several components may be removed from all the components disclosed in the embodiments. Further, components of different embodiments may be appropriately combined.

What is claimed is:

1. A fluorescent device comprising:
an integrally formed body including a binder and a plurality of fluorescent materials scattered in the binder, wherein the integrally formed body radiates emission light when irradiated with excitation light on an irradiation surface thereof; and
a reflective layer which reflects the emission light,
wherein the integrally formed body has a convex-concave shape at a different surface of the integrally formed body, the different surface being different from the irradiation surface, and
wherein the reflective layer is provided at the different surface on a flat area at a part of the convex-concave shape.

2. The fluorescent device according to claim 1, wherein the area of the different surface on which the reflective layer is provided corresponds to an irradiation area in which the excitation light is irradiated on the irradiation surface.

3. The fluorescent device according to claim 1, wherein the integrally formed body has the convex-concave shape over substantially all of the different surface.

4. The fluorescent device according to claim 1, wherein the irradiation surface and the different surface face each other in parallel.

5. An irradiation apparatus comprising:
the fluorescent device according to claim 1;
an excitation light source which outputs excitation light;
an irradiation optical system which irradiates the fluorescent device with the excitation light output from the excitation light source; and
an emission-light-extraction optical system which extracts, as irradiation light, the emission light emitted from the fluorescent device.

6. A projector apparatus comprising:
the irradiation apparatus according to claim 5; and
a projection optical system which projects, as a color image, light of colors including the irradiation light output from the irradiation apparatus.

7. The fluorescent device according to claim 1, wherein the fluorescent materials and binder are provided in the convex-concave shape of the integrally formed body.

8. The fluorescent device according to claim 1, wherein the convex-concave shape of the integrally formed body is a structure obtained by sintering the binder and the plurality of fluorescent materials scattered in the binder.

* * * * *